(12) United States Patent
Kang et al.

(10) Patent No.: US 7,348,539 B2
(45) Date of Patent: Mar. 25, 2008

(54) IMAGE SENSOR FOR SEMICONDUCTOR LIGHT-SENSING DEVICE AND IMAGE PROCESSING APPARATUS USING THE SAME

(75) Inventors: Shin Jae Kang, Kyungki-do (KR); Won Tae Choi, Kyungki-do (KR); Joo Yul Ko, Kyungki-do (KR); Deuk Hee Park, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 54 days.

(21) Appl. No.: 11/387,696

(22) Filed: Mar. 24, 2006

(65) Prior Publication Data

US 2006/0266921 A1 Nov. 30, 2006

(30) Foreign Application Priority Data

May 25, 2005 (KR) .............. 10-2005-0044149

(51) Int. Cl.
*G01J 3/60* (2006.01)
*H01J 40/14* (2006.01)
*H01J 6/16* (2006.01)

(52) U.S. Cl. ............. 250/226; 250/208.1; 250/216; 250/214.1; 257/257; 257/290

(58) Field of Classification Search .......... 250/208.1, 250/214.1, 216, 226; 257/257, 432, 290–294, 257/435; 356/414, 419
See application file for complete search history.

(56) References Cited

U.S. PATENT DOCUMENTS

| 6,714,243 | B1 | 3/2004 | Mathur et al. |
| 6,783,900 | B2 | 8/2004 | Venkataraman |
| 6,841,816 | B2 * | 1/2005 | Merrill et al. ............. 257/294 |
| 2005/0242271 | A1 * | 11/2005 | Weng et al. ............. 250/214.1 |

FOREIGN PATENT DOCUMENTS

JP 2004-304706 10/2004

OTHER PUBLICATIONS

Korean Intellectual Property Office, Office Action mailed, Sep. 15, 2006.

* cited by examiner

*Primary Examiner*—Patrick J. Lee
(74) *Attorney, Agent, or Firm*—Lowe Hauptman Ham & Berner

(57) ABSTRACT

An image sensor for an image processing apparatus having a color filter array with open window cells alternating with single color filter cells includes a lens array containing a plurality of microlenses, a color filter array having a plurality of open window cells and color filter cells, each corresponding to one microlens. The image sensor also includes a protection layer, and a pixel sensor array having a first photosensor sensing a first light passed through each color filter cell, a second photosensor formed under the first photosensor, sensing a second light passed through each color filter cell, a third photosensor sensing a third light passed through each open window cell, and a fourth photosensor formed under the third photosensor, sensing a fourth light passed through each open window cell.

18 Claims, 13 Drawing Sheets

12

| G | R | G | R | G |
|---|---|---|---|---|
| B | G | B | G | B |
| G | R | G | R | G |
| B | G | B | G | B |
| G | R | G | R | G |

PRIOR ART

2X2 Interpolation

$ri = R$
$gi = (G+G) / 2$
$bi = B$

| G | R | G | R | G |
|---|---|---|---|---|
| B | G | B | G | B |
| G | R | G | R | G |
| B | G | B | G | B |
| G | R | G | R | G |

(b)

3X3 Interpolation

3X3 Interpolation in Red Pixel
$ri = R$
$gi = (G+G+G+G) / 4$
$bi = (B+B+B+B) / 4$

3X3 Interpolation in Green Pixel
$ri = (R+R) / 2$
$gi = (G+G+G+G+G) / 5$
$bi = (B+B) / 2$

3X3 Interpolation in Blue Pixel
$ri = (R+R+R+R) / 4$
$gi = (G+G+G+G) / 4$
$bi = B$

| G | R | G | R | G |
|---|---|---|---|---|
| B | G | B | G | B |
| G | R | G | R | G |
| B | G | B | G | B |
| G | R | G | R | G |

PRIOR ART

2X2 Interpolation ri = (R1+R4) / 2
gi = (G2+G3) / 2
bi = (B1+B4) / 2

(b)

3X3 Interpolation ri = (R+R+R+R+R) / 5
gi = (G+G+G+G) / 4
bi = (B+B+B+B+B) / 5

IMAGE SENSOR FOR SEMICONDUCTOR LIGHT-SENSING DEVICE AND IMAGE PROCESSING APPARATUS USING THE SAME

CLAIM OF PRIORITY

This application claims the benefit of Korean Patent Application No. 2005-44149 filed on May 25, 2005, in the Korean Intellectual Property Office, the disclosure of which is incorporated herein by reference.

BACKGROUND OF THE INVENTION

1. Field of the Invention

The present invention relates to an image sensor and an image processing apparatus adopted in camcorders, digital cameras, etc. More particularly, the invention relates to an image sensor for semiconductor light-sensing device which uses a color filter array having open windows and single-color filters alternating with each other, using information of a plurality of colors for each pixel to allow more accurate interpolation, thereby extracting a more accurate color for each pixel, and to an image processing apparatus using the same.

2. Description of the Related Art

In general, the recent developments in the picture communication by wire/wireless high-speed network system, and the picture input and recognition technology such as used in digital cameras have led to increased use of digital camera modules in mobile telecommunication terminals such as mobile phones. Accordingly, there have been active research and development in image sensors adopted in the digital camera modules.

Such an image sensor is a sensor which senses light reflected by an object to sense an object image. It is broadly divided into a Charge Coupled Device (CCD) type and a Complementary Metal Oxide Semiconductor (CMOS) type depending on the manufacturing technology.

The CCD image sensor moves an electron generated by light to an output part using a gate pulse. In this process, the voltage may change due to external noise but no change is incurred in the number of electrons. Thus, the noise does not affect the output signal, which indicates superior characteristics against noise. Because of such a merit, the CCD type image sensor is extensively used in multimedia devices such as digital cameras and camcorders which require a superior picture quality.

On the other hand, the CMOS image sensor (CIS) converts an electron generated by light into a voltage in each pixel and output the voltage afterwards through multiple CMOS switches. At this point, the voltage signal may be degenerated due to noise, which indicates mediocre characteristics against noise. However, as the merits of the CIS such as low manufacturing costs, low power consumption and possible integration with nearby circuits, compared with the CCD type, became widely known, there have been efforts to improve the CMOS processing technology as well as signal-processing algorithm in the late 1990s. Thus, the existing shortcomings have been improved over time, and recently there have been more active researches on the CIS.

The most representative technology related to the image sensors includes the Bayer pattern of a color filter array, and three-photodiode color sensor which allows sensing all three colors in each pixel. The Bayer pattern technology is used in most of the image sensors today, in which the three colors are separated by a color filter so that light is sensed at each pixel.

FIG. 1 is a block diagram illustrating a conventional image processing apparatus.

With reference to FIG. 1, the conventional image processing apparatus is composed of an image sensor 10 including a plurality of microlenses 11, a color filter array 12, a protection layer 13, and a pixel sensor array 14, and a signal processor 20 for processing signals such as via interpolation of color signals R, G, B from the image sensor.

Here, the color filter array 12 adopts the Bayer pattern, illustrated in FIG. 1, which is used in most of the image sensors including the CCD type.

Figure 2:
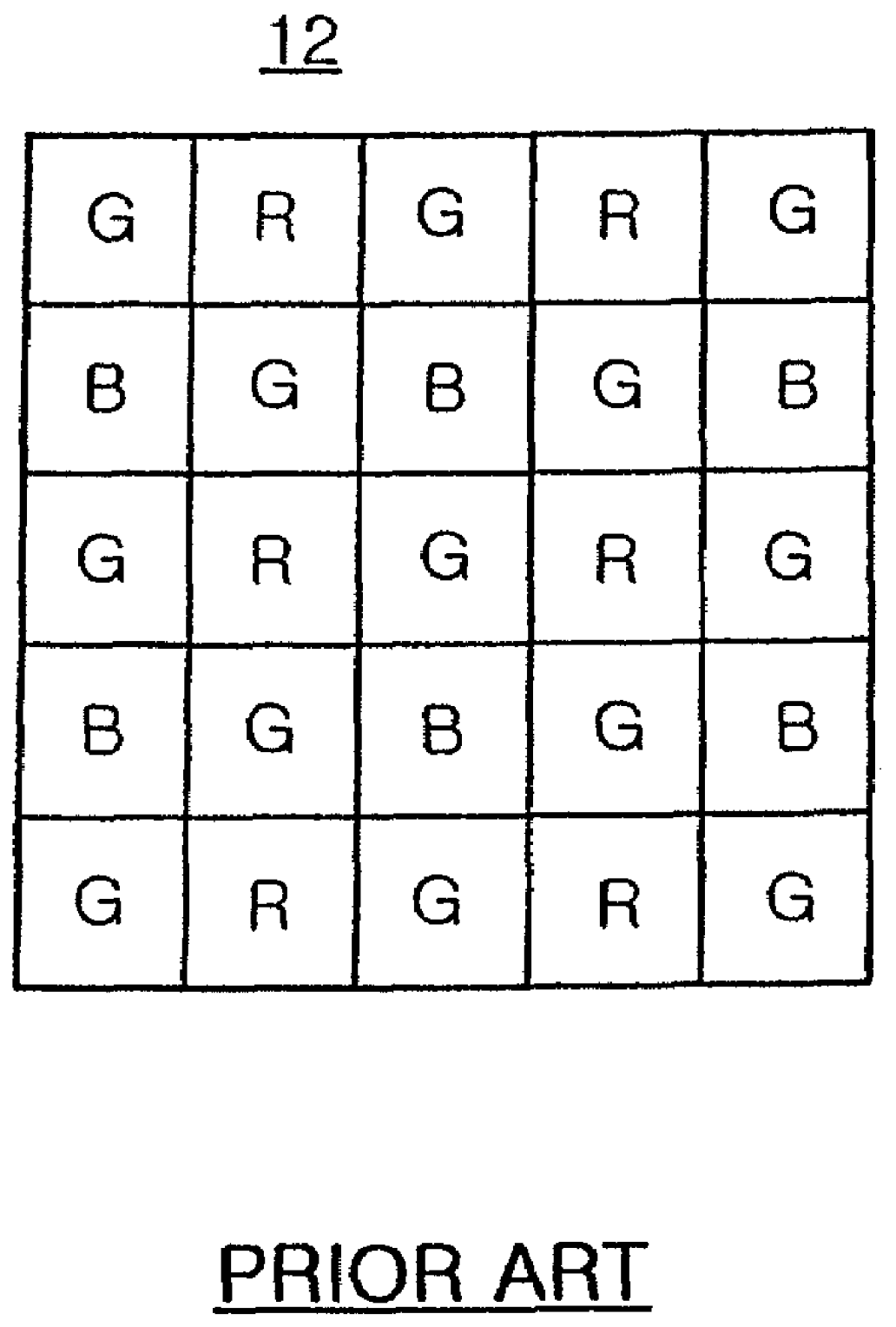

FIG. 2 is a diagram illustrating the Bayer pattern of the color filter array shown in FIG. 1.

Referring to FIGS. 1 and 2, the color filter array 12 adopts the widely known Bayer pattern. The Bayer pattern is composed of basic units each made up of 2 by 2 cells, in which two green filter are disposed diagonally and one of each red and blue filters are disposed diagonally. Since the human eye is more sensitive to green than red and blue, the green filter area is composed of two cells.

The pixel sensor array 14 includes a photosensor for receiving light by a photodiode, and a signal detector for outputting a signal generated by the photosensor. The miniaturization of the photosensor and the signal detector is the core technology of the CMOS image sensor. The photosensor is a photodiode of a general P-N junction structure which is compatible with the general CMOS image sensor, thus widely used in CMOS image sensors. The structure of the pixel sensor array including such a photosensor is as shown in FIG. 3.

FIG. 3 is a block diagram illustrating the pixel sensor array of the image sensor shown in FIG. 1.

Referring to FIGS. 1 and 3, the pixel sensor array 14 includes a P+ substrate 14-1, a P-epitaxial layer 14-2 grown on the P+ substrate 14-1, an n-well layer 14-3 formed on the P-epitaxial layer 14-2, which forms a photosensor of a single P-N junction structure capable of receiving light, and a P+ shallow junction layer 14-4 which is formed of P+ semiconductor material in a predetermined depth from an upper surface of the P-epitaxial layer 14-2. The N-well layer has a junction depth of about 0.6 μm.

In addition, the signal detector converts a signal, which is converted from light by the photosensor, into a voltage to be outputted to the signal processor 20.

FIGS. 4(a) and (b) are diagrams for explaining interpolation by the signal processor shown in FIG. 1.

Referring to FIGS. 4(a) and (b), the interpolation process by the signal processor 20 is determined by the pattern of the color filter adopted in the image sensor 10.

With reference to FIG. 4 (a), in the case where a unit for interpolation is set as 2 by 2 cells, the 2 by 2 interpolation is conducted according to following Equation 1, thereby obtaining the color information ri, gi and bi for red R, green G and blue B with respect to an arbitrary pixel.

$$ri = R$$

$$gi = (G+G)/2$$

$$bi = B \qquad \text{Equation 1}$$

Here, ri, gi and bi are RGB color information for an arbitrary pixel, obtained from the interpolation.

As shown in Equation 1, the RGB color information of each pixel is obtained from the interpolation. Here, the green information gi is obtained on the basis of two color signals in an arbitrary pixel but the red information ri and the blue information bi are obtained on the basis of only one color signal respectively. Thus, if the red R and blue B signals are distorted by noise in this case, this may be a cause for an error in the CMOS image sensor such as the fixed pattern noise. That is, if white and dark noises take up large portions in red and blue signals due to lack of uniformity in the manufacturing process, the interpolation becomes less accurate due to the fixed pattern noise. This is more severe in the case of highly dense pixel arrangement with small pixels.

In order to overcome such a shortcoming, 3 by 3 interpolation is sometimes used in high-density image sensors, which will be explained below with reference to FIG. 4 (b).

Referring to FIG. 4 (b), with the Bayer pattern of the color filter array 12, 3×3 interpolation is conducted according to the following Equation 2, thereby obtaining red, green and blue color information ri, gi and bi.

1. 3×3 interpolation in red pixel $ri = R$ $gi = (G+G+G+G)/4$ $bi = (B+B+B+B)/4$ 2. 3×3 interpolation in green pixel $ri = (R+R)/2$ $gi = (G+G+G+G+G)/5$ $bi = (B+B)/2$ 3. 3×3 interpolation in blue pixel $ri = (R+R+R+R)/4$ $gi = (G+G+G+G)/4$ $bi = B$ Equation 2

As shown in Equation 2, in the red pixel, the green G information and blue B information gi and bi is obtained from an average value of the adjacent 4 color signals but the red R information ri is obtained from a single color signal. In the blue pixel, the red R and green G information ri and gi is obtained from an average value of the adjacent 4 color signals but the blue B information bi is obtained from a single color signal. As such, 3 by 3 interpolation allows obtaining-color information from an average value of maximum 5 color signals, and thus not affected as much by the fixed pattern noise as 2 by 2 interpolation. Still, 3 by 3 interpolation includes a case of obtaining color information from a single color signal, sharing the problem exhibited in 2×2 interpolation.

As described above, in the conventional image sensor and the image processing apparatus, the color information for each pixel is obtained on the basis of a single color signal. In that case, if red R and blue B signals are distorted by noise, there occurs an error such as the fixed pattern noise in the CMOS image sensor. Also, if white and dark noises take up large portions due to lack of uniformity in the manufacturing process, the interpolation becomes less accurate due to the fixed pattern noise, which does not allow extraction of accurate color information for each pixel.

SUMMARY OF THE INVENTION

The present invention has been made to solve the foregoing problems of the prior art and it is therefore an object of the present invention to provide an image sensor for semiconductor light-sensing device which uses a color filter array having open window cells alternating with single color filter cells to allow using information of a plurality of colors for each pixel during interpolation, minimizing the effects from defective pixels or noise to enable more accurate interpolation, thereby extracting more accurate color for each pixel and an image processing apparatus using the same.

According to an aspect of the invention for realizing the object, there is provided an image sensor including: a lens array containing a plurality of microlenses arranged in a two-dimensional matrix; a color filter array formed underneath the lens array, including a plurality of open window cells and a plurality of color filter cells, each corresponding to each microlens of the lens array, wherein each open window cell passes red, green and blue lights, while each color filter cell passes a predetermined color light; a protection layer formed of dielectric material underneath the color filter array; and a pixel sensor array formed underneath the protection layer, having a first photosensor sensing a first light passed through each color filter cell, a second photosensor formed under the first photosensor, sensing a second light passed through each color filter cell, a third photosensor sensing a third light passed through each open window cell, and a fourth photosensor formed under the third photosensor, sensing a fourth light passed through each open window cell.

According to another aspect of the invention for realizing the object, there is also provided an image processing apparatus including: a lens array including plurality of microlenses arranged in a two-dimensional matrix; a color filter array formed underneath the lens array, including a plurality of open window cells and a plurality of color filter cells alternating with each other in rows and lines, each corresponding to each microlens of the lens array, wherein each open window cell passes red, green and blue lights while each color filter cell passes a predetermined color light; a protection layer formed of dielectric material underneath the color filter array; a pixel sensor array, formed underneath the protection layer, having a first photosensor for sensing a first light passed through each of the plurality of color filter cells, a second photosensor formed under the first photosensor, sensing a second light passed through each of the plurality of color filter cells, a third photosensor, sensing a third light passed through each of the plurality of open window cells, and a fourth photosensor formed under the third photosensor, sensing a fourth light passed through each of the plurality of open window cells; and a signal processor for A/D converting a first signal, a second signal, a third signal and a fourth signal sensed by the first photosensor, the second photosensor, the third photosensor and the fourth photosensor of the pixel sensor array, respectively, into digital signals and extracting color information from the digital signals.

In the image sensor and the image processing apparatus of the present invention, the color filter array has the same corresponding dimensions as the lens array.

The color filter cell of the color filter array passes a color selected from a group consisting of red, green, blue, yellow, magenta, cyan and emerald green.

The pixel sensor array includes: abase substrate formed of P-type semiconductor material; an epitaxial layer formed of P-type semiconductor material on the base substrate; a first photowell layer having a plurality of first photowell areas formed of N-type semiconductor material in a predetermined first depth from an upper surface of the epitaxial layer, wherein the each of the first photowell areas forms the first photosensor and the third photosensor via P-N junction with the epitaxial layer; and a second photowell layer having a plurality of second photowell areas formed of N-type semiconductor material having a predetermined thickness, in a second depth predetermined deeper than the first depth from the upper surface of the epitaxial layer, wherein each of the plurality of second photowell areas overlaps with each of the plurality of first photowell areas and forms the second photosensor and the fourth photosensor via P-N junction with the epitaxial layer.

The pixel sensor array further includes a P+ shallow junction layer made of P+ semiconductor material in a predetermined third depth from the upper surface of the epitaxial layer in order to prevent any surface defects of the epitaxial layer.

The first photowell layer of the pixel sensor array is formed in the first depth which is about 0.6 μm.

The second photowell layer of the pixel sensor array is formed in the second depth which is from about 2.75 μm to about 3.5 μm.

The P+ shallow junction layer of the pixel sensor array is formed in the third depth which is from about 0.01 μm to about 0.2 μm.

The second depth of the second photowell layer of the pixel sensor array is smaller in case where the color filter cell of the color filter array is a red filter than where the color filter cell of the color filter array is a green or a blue filter.

In addition, in the image processing apparatus of the present invention, the signal processor is configured to A/D convert a light signal sensed via a 2 by 2 cell unit composed of two open window cells and two color filter cells into a digital signal and extract color information from the digital signal.

Alternatively, the signal processor is configured to A/D convert a light signal sensed via a 3×3 cell unit composed of four open window cells and five color filter cells into a digital signal and extract color information from the digital signal

BRIEF DESCRIPTION OF THE DRAWINGS

The above and other objects, features and other advantages of the present invention will be more clearly understood from the following detailed description taken in conjunction with the accompanying drawings, in which:

FIG. 2 is a diagram illustrating a pattern of a pixel sensor array of the image sensor shown in FIG. 1;

FIG. 4 is a diagram illustrating interpolation of a signal processor shown in FIG. 1;

DETAILED DESCRIPTION OF THE PREFERRED EMBODIMENT

Figure 1:
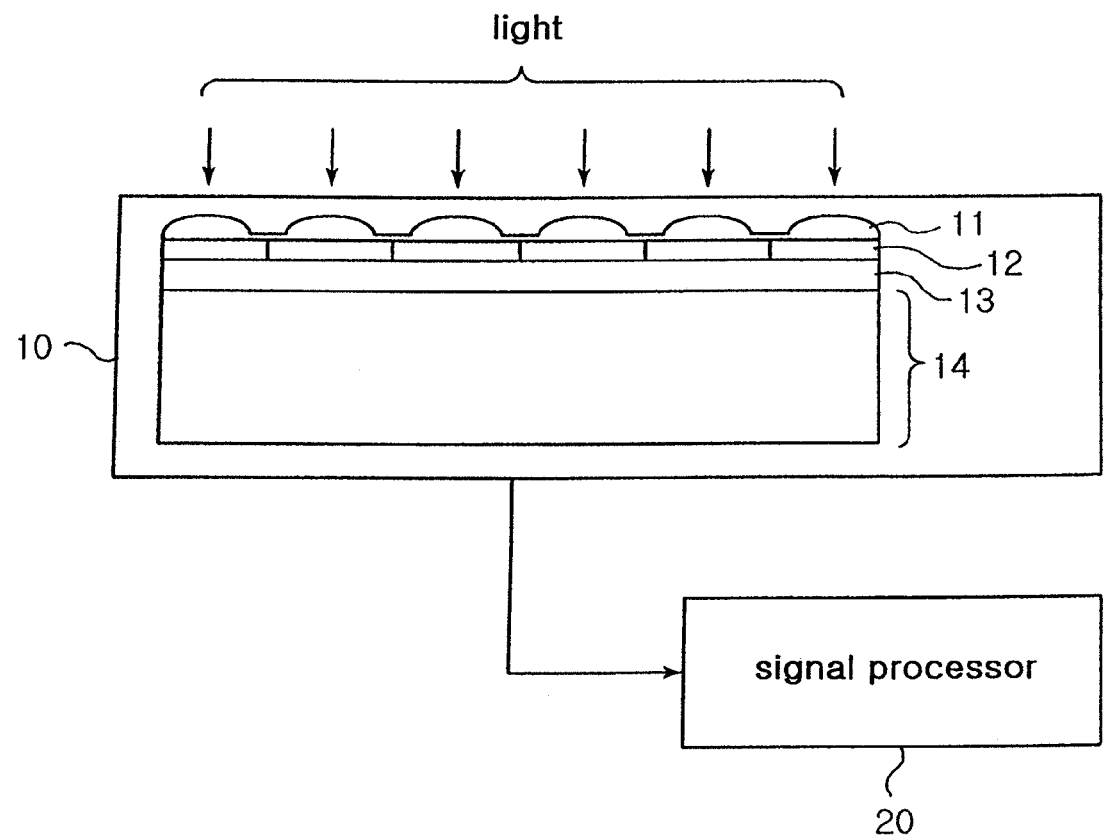
FIG. 1 is a block diagram of a conventional image processing apparatus.
Figure 3:
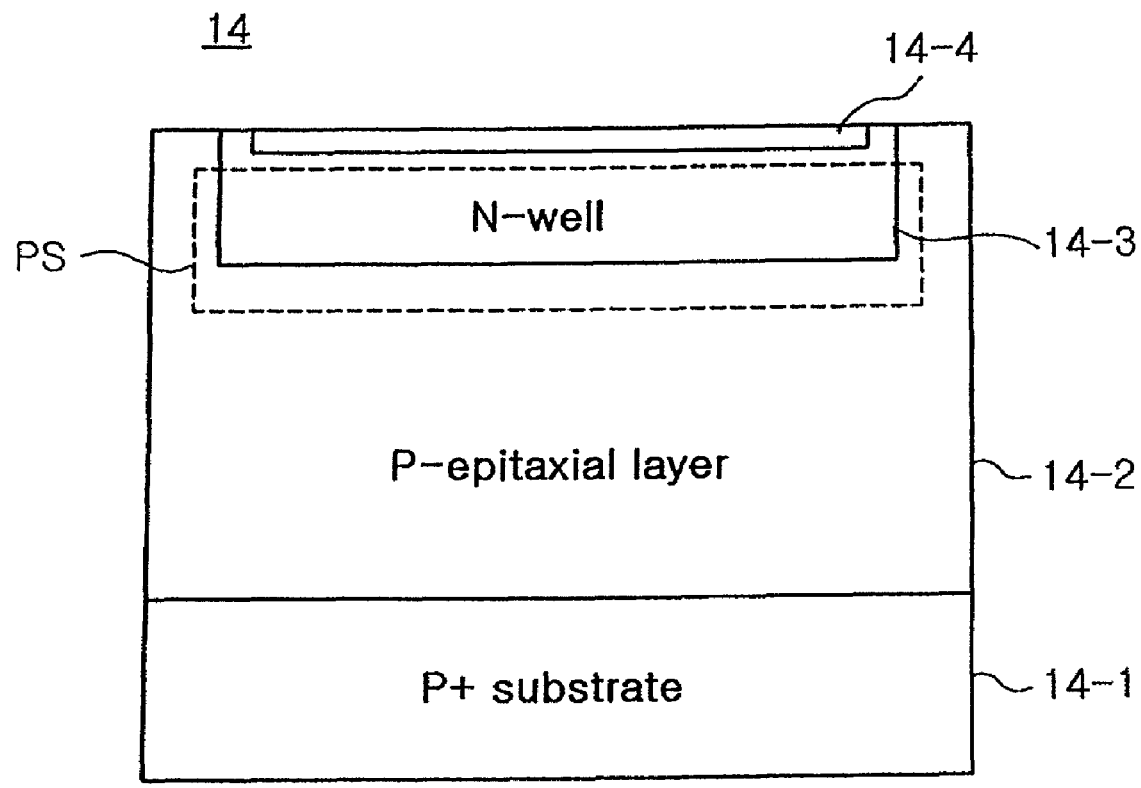
FIG. 3 is a structural diagram illustrating the pixel sensor array of the image sensor shown in FIG. 1.

Preferred embodiments of the present invention will now be described in detail with reference to the accompanying drawings. The constituent parts having substantially the same functions and constitutions will be denoted by the same reference numerals.

Figure 5:
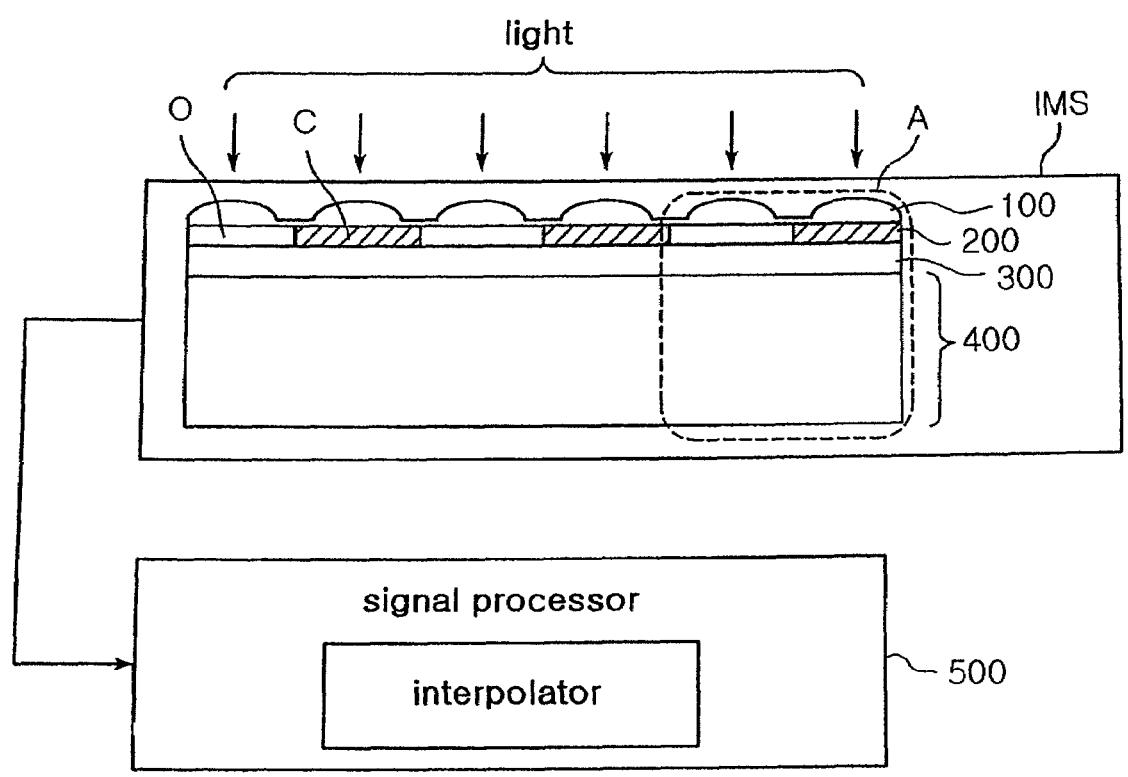
FIG. 5 is a block diagram illustrating an image processing apparatus according to the present invention.

FIG. 5 is a block diagram of an image processing apparatus according to the present invention.

With reference to FIG. 5, the image processing apparatus according to the present invention includes an image sensor (IMS) for sensing light from an object image and a signal processor 500 for processing a signal from the IMS.

With reference to FIG. 5, the IMS includes a lens array 100, a color filter array 200, a protection layer 300 and a pixel sensor array 400 each formed in a silicon semiconductor. The lens array 100 includes a plurality of microlenses 110 formed in a two-dimensional matrix. Here, each microlens focuses the incident light to a predetermined region.

Figure 6:
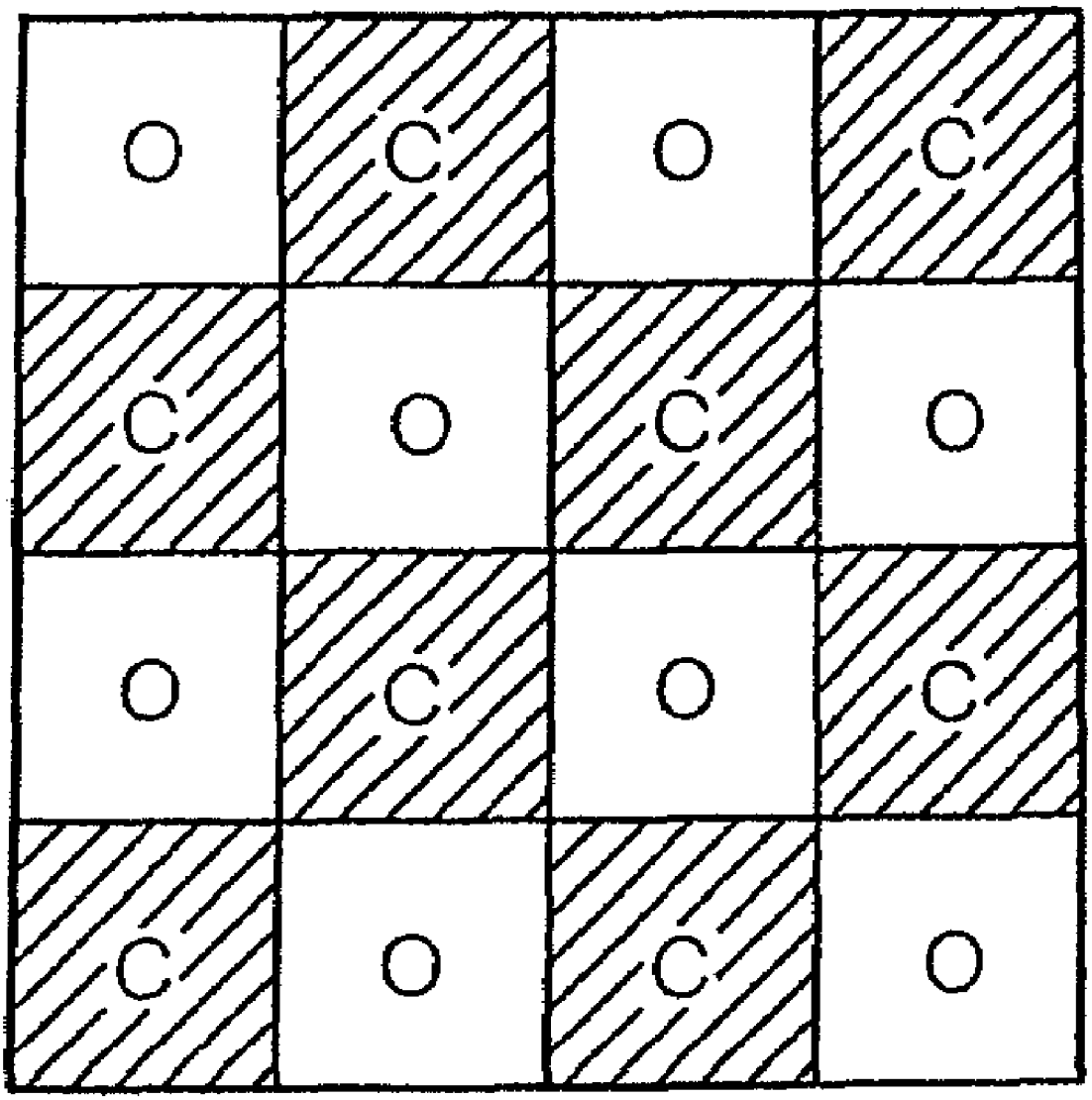
FIG. 6 is a diagram illustrating a pattern of a color filter array of the image sensor shown in FIG. 5.

FIG. 6 is a diagram illustrating a pattern of a color filter array of the IMS shown in FIG. 5.

Referring to FIGS. 5 and 6, the color filter array 200 is formed underneath the lens array 100, including a plurality of open window cells O and color filter cells C each corresponding to each of the microlenses. The open window cells O alternate with the color filter cells C in rows and lines. Each of the open window cells O allows the passage of all red R, green G, and blue B lights incident through each microlens. Each of the color filter cells C allows the passage of a predetermined light of color from among the lights incident through each microlens.

That is, the color filter array 200 is composed of the plurality of open window cells O and color filter cells C arranged in a check pattern. For example, the color filter cells C are disposed in 4 positions which are upper and lower, left and right of one open window cell O, and the open window cells O are disposed in 4 positions which are upper and lower, left and right of one color filter cell C.

The color filter array 200 having a check pattern is formed in the substantially same, corresponding dimensions as the lens array 100 so that each microlens of the lens array 100 is aligned with the open window cell O or the color filter cell C.

Figure 9:
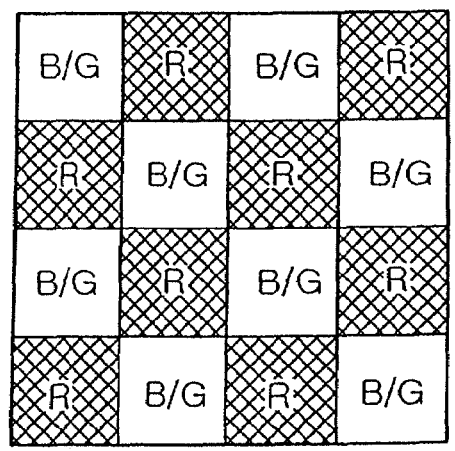
FIGS. 9(a), (b) and (c) are diagrams illustrating examples of check patterns of the color filter array shown in FIG. 6.
Figure 9:
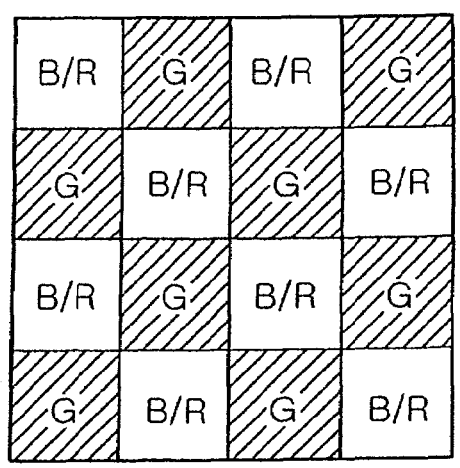
Figure 9:
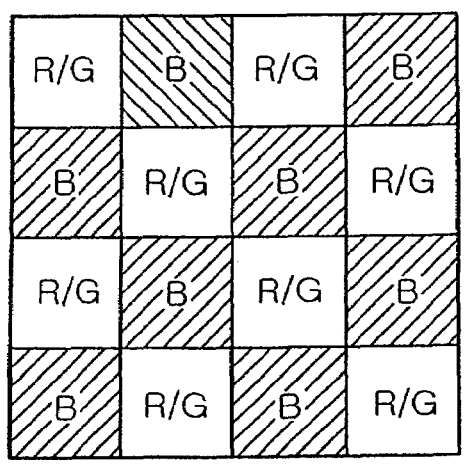

In addition, the filtering color of the color filter cells of the color filter array 200 is one selected from a group consisting of red R, green G, blue B, yellow Y, magenta, cyan and emerald green, which will be explained with reference to FIG. 9.

With reference to FIG. 5, the protection layer 300 is formed of dielectric material, underneath the color filter array. The protection layer 300 functions to protect the circuit patterns for connecting each of the photosensors with the external circuits or the circuit elements which convert the light from the photosensor into electric signals.

Figure 7:
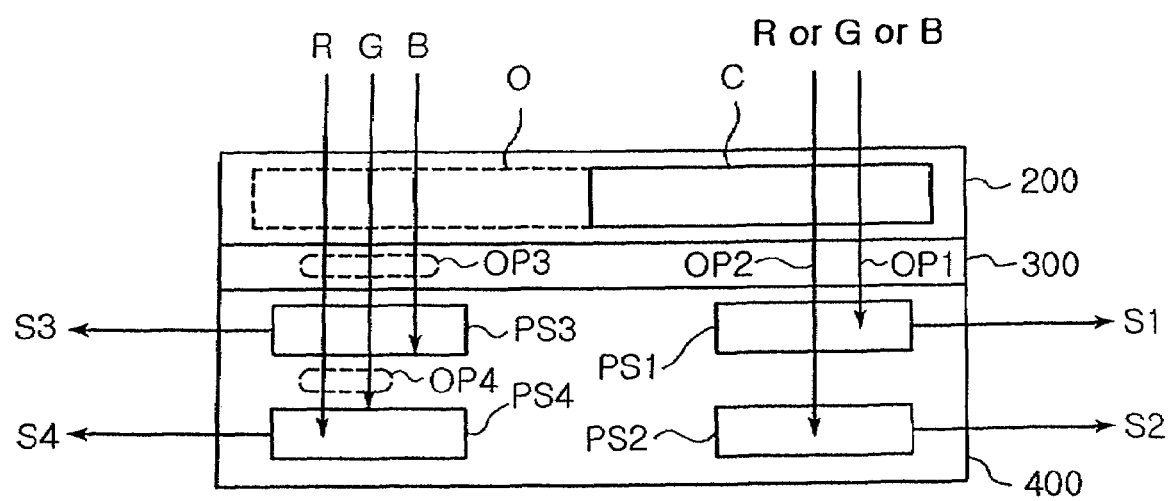
FIG. 7 is a block diagram illustrating a pixel sensor array of the image sensor shown in FIG. 5.

FIG. 7 is a block diagram illustrating the pixel sensor array of the image sensor shown in FIG. 5.

With reference to FIGS. 5 to 7, the pixel sensor array 400, formed underneath the protection layer 300, includes a first photosensor PS1 for sensing a first light OP1 and a second photosensor PS2 for sensing a second light OP2, the second photosensor PS2 formed under the first photosensor PS1, each light passed through each of the plurality of color filter cells C, and a third photosensor PS3 for sensing a third light OP3 and a fourth photosensor PS4 for sensing a fourth light OP4, the fourth photosensor PS4 formed under the third photosensor PS3, each light passed through each of the plurality of open window cells O.

Here, the first light OP1 and the second light OP2 are the lights that passed through the color filter cells C. The third light OP3 is the light that passed through the open window cell O, containing all red R, green G, and blue B lights, and the fourth light OP4 is the light that passed through the open window cell O, containing red R and green G lights.

Figure 8:
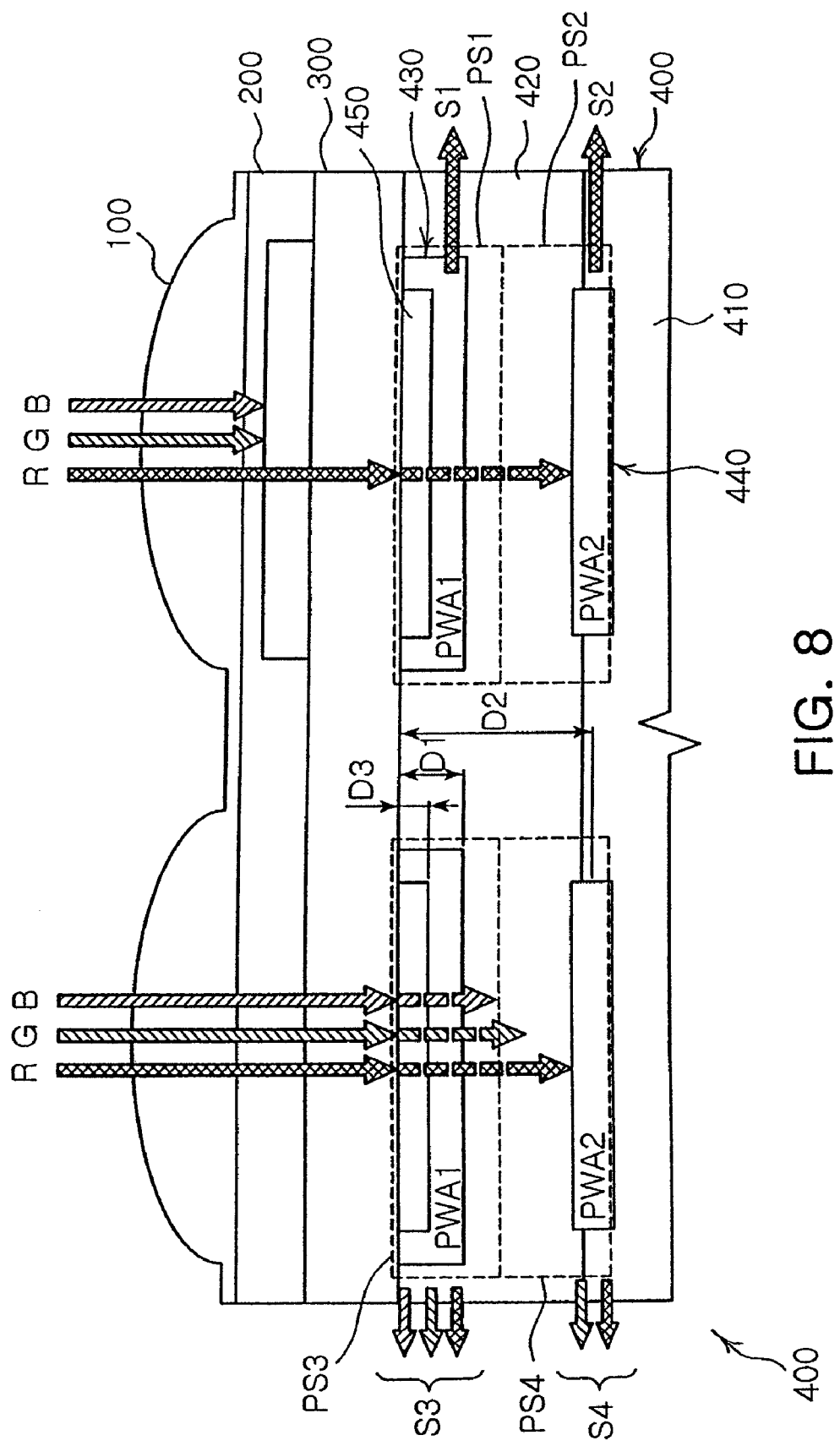
FIG. 8 is a magnified view of part A of the pixel sensor array of the image sensor shown in FIG. 5.

FIG. 8 is a magnified view of part A of the pixel sensor array of the image sensor shown in FIG. 5.

Referring to FIGS. 5 to 8, the pixel sensor array 400 includes a base susbtrate 410, an epitaxial layer 420, a first photowell layer 430, and a second photowell layer 440.

The base substrate 410 is formed of P-type semiconductor material.

The epitaxial layer 420 is formed of P-type semiconductor material on the base substrate 410.

The first photowell layer 430 includes a plurality of first photowell areas PWA1 formed of N-type semiconductor material in a predetermined first depth D1 from the upper surface of the epitaxial layer 420. Each first photowell area PWA1 is configured to form the first photosensor PS1 and the third photosensor PS3 via P-N junction with the epitaxial layer 420.

Here, the first photosensor PS1 detects the first light to output a first signal S1, and the second photosensor PS2 detects the second light to output a second signal S2. The third photosensor PS3 detects the third light to output a third signal S3 and the fourth photosensor PS4 detects the fourth light to output a fourth signal S4.

The second photowell layer 400 includes a plurality of second photowell areas PWA2 formed in a second depth D2 which is predetermined to be deeper than the first depth D1 from the upper surface of the epitaxial layer 420. The second photowell areas PWA2 are formed of N-type semiconductor material having a predetermined thickness. Each of the second photowell areas PWA2 overlaps with each of the plurality of first photowell areas PWA1, and configured to form the second photosensor PS2 and the fourth photosensor PS4 via P-N junction with the epitaxial layer 420.

As described above, the pixel sensor array 400 of the present invention includes photosensors with double junction structures formed by the first photowell layer 430 and the second photowell layer 440. That is, in order to sense the first light and the second light passed through each color filter cell C, the first photosensor PS1 and the second photosensor PS2 form a double junction structure. Also, in order to sense the third light and the fourth light passed through each open window cell O, the third photosensor PS3 and the fourth photosensor PS4 form a double junction structure.

In addition, in order to prevent any defects to the surface of the epitaxial layer 420, the pixel sensor array 400 may further include a P+ shallow junction layer 450 which is formed of P+ semiconductor material in a predetermined third depth D3 from the upper surface of the epitaxial layer 420. The P+ shallow junction layer 450 prevents the epitaxial layer 420 from being exposed to the outside, thus preventing leaking of current that may occur from possible exposure of the epitaxial layer 420. In addition, silicon may be used for the semiconductor material that is used to form each layer of the pixel sensor array 400 of the present invention.

In the meantime, the reason that the color information contained in the detected signal varies according to the depths in which the third and fourth photosensors PS3 and PS4 are formed is that the depth to which the light permeates inside the semiconductor (the depth at which the light reaches inside the semiconductor) varies according to the wavelength of light. Accordingly, the depths to which blue B, green G and red R permeate into the semiconductor material are different from each other. For example, the permeation depths of blue B, green G and red R are about 1 μm, 3 μm and 6 μm, respectively.

With these differences in permeation depths depending on the wavelength of light, the first photowell layer 430 and the second photowell layer 440 are formed in depths considering the permeation depth of the wavelength of desired light in order to detect the desired color signal.

For example, if the first depth D1 in which the first photowell layer 430 of the pixel sensor array 400 is formed is small, the light-sensing capability for blue is enhanced. However, the depth tends to be about 6 μm due to manufacturing process, and if the depth is greater, the sensing capability for red and green lights becomes weaker.

The second photowell layer 440 of the pixel sensor array 400 is formed in the second depth which is about 2.75 μm to about 3.5 μm, and in a thickness of about 0.75 μm. If the thickness is smaller, the sensing capability for red and green light becomes weaker.

The P+ shallow junction layer 450 of the pixel sensor array 400 is formed in the third depth D3 which is determined within a range of about 0.01 μm to about 0.2 μm.

As described above, as the color filter cell C of the color filter array 200 is of a particular color filter that passes any one color from red R, green G and blue B, only that particular color information from red R, green G and blue B can be obtained from the first and second lights passed through the color filter cell C, by the first and second photosensors PS1 and PS2. On the other hand, information on all red R, green G and blue B can be obtained from the third and fourth lights through the open window cells O, by the third and fourth photosensors PS3 and PS4.

In the photosensor having such a double junction structure, the light passed through the open window cell C is detected by the third and fourth photosensors PS3 and PS4, which then output third and fourth, signals S3 and S4 through output terminals thereof. The third signal S3 contains the color information of red R, green G and blue B, and the fourth signal S4 contains the color information of green G and red R. In addition, the light passed through the color filter cell C is detected by the first and second photosensors PS1 and PS2, which then output first and second signals S1 and S2 through output terminals thereof. The first signal S1 and the second signal S2 contain the color information of only red R, and thus, can be connected via a single wire and outputted as an integrated signal. As a result, the photosensors PS3 and PS4 having the double junction structure which detect the light passed through the open window cell O output two signals S3 and S4, whereas the photosensors PS1 and PS2 having the double junction structure output one signal S1+S2.

FIGS. 9(a), 9(b) and 9(c) are diagrams showing the examples of check patterns of the color filter array.

FIG. 9(a) shows the check pattern in case where the color filter cell C is a red filter. The red passed through the color filter cell C is denoted by R, and the blue and green excluding red among all the lights passed through the open window cell O is denoted by B/G.

FIG. 9(b) shows the check pattern in the case where the color filter cell C of the color filter array is a green G filter. The green passed through the color filter cell C is denoted by G, and the blue and red excluding green among all the lights passed through the open window cell O is denoted by B/R.

In addition, FIG. 9(c) shows the check pattern in the case where the color filter cell C of the color filter array 200 is a blue B filter. The blue passed through the color filter cell C is denoted by B, and the red and green excluding blue among all the lights passed through the open window cell O is denoted by R/G.

Figure 10A:
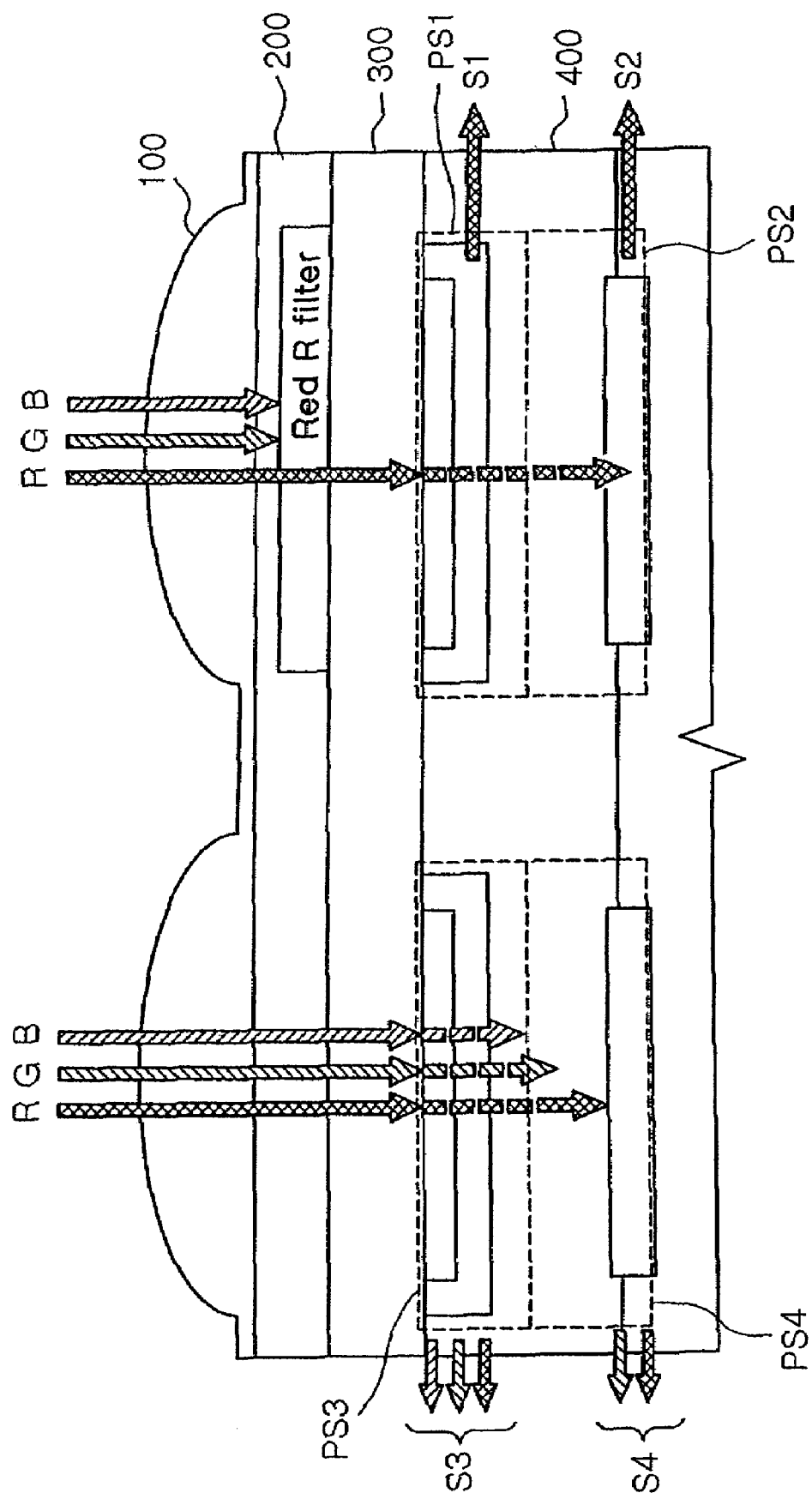
FIGS. 10a to 10c are diagrams illustrating the principle of light-sensing by different color filters of the color filter array of the present invention.
Figure 10B:
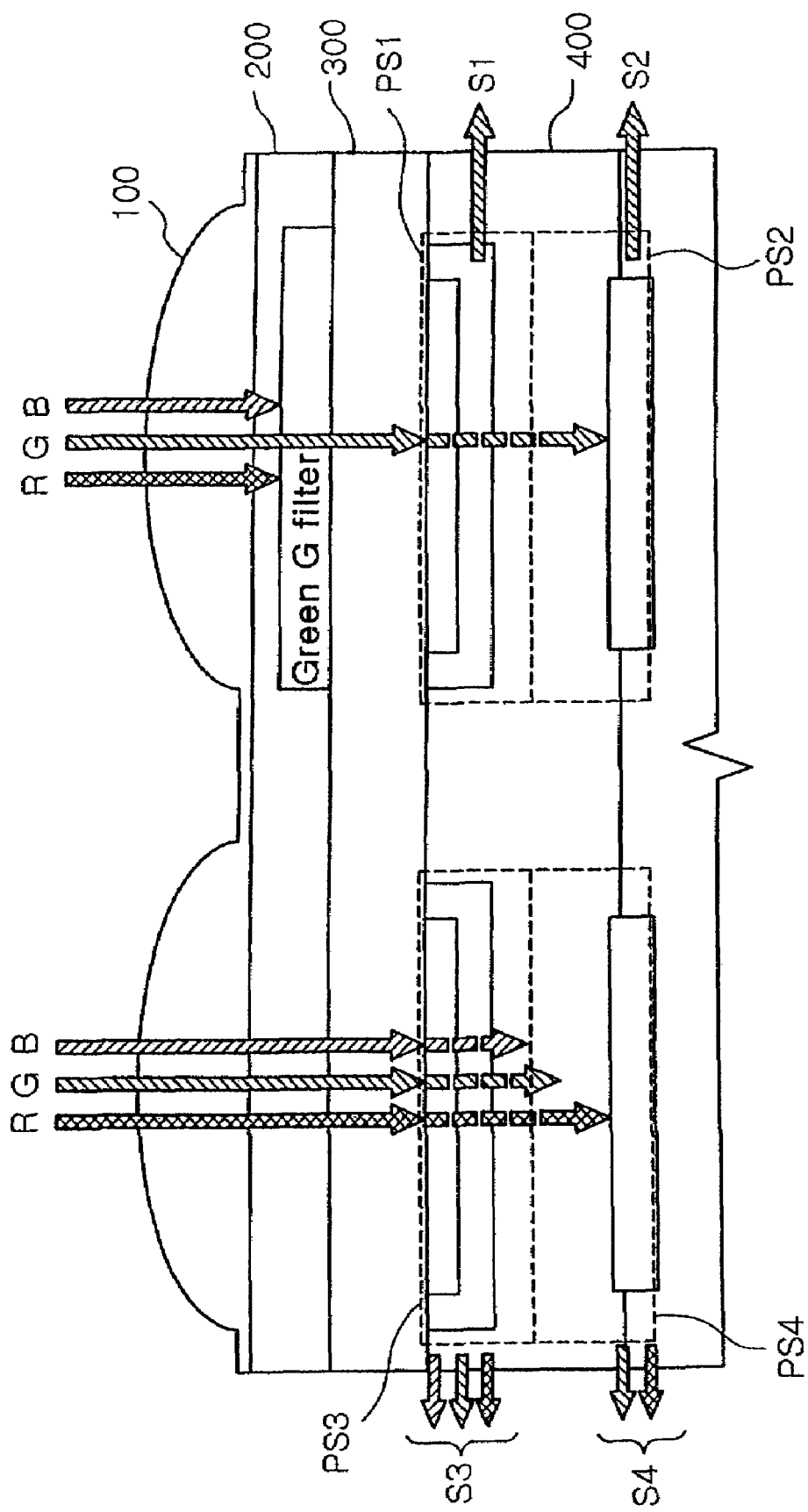
Figure 10C:
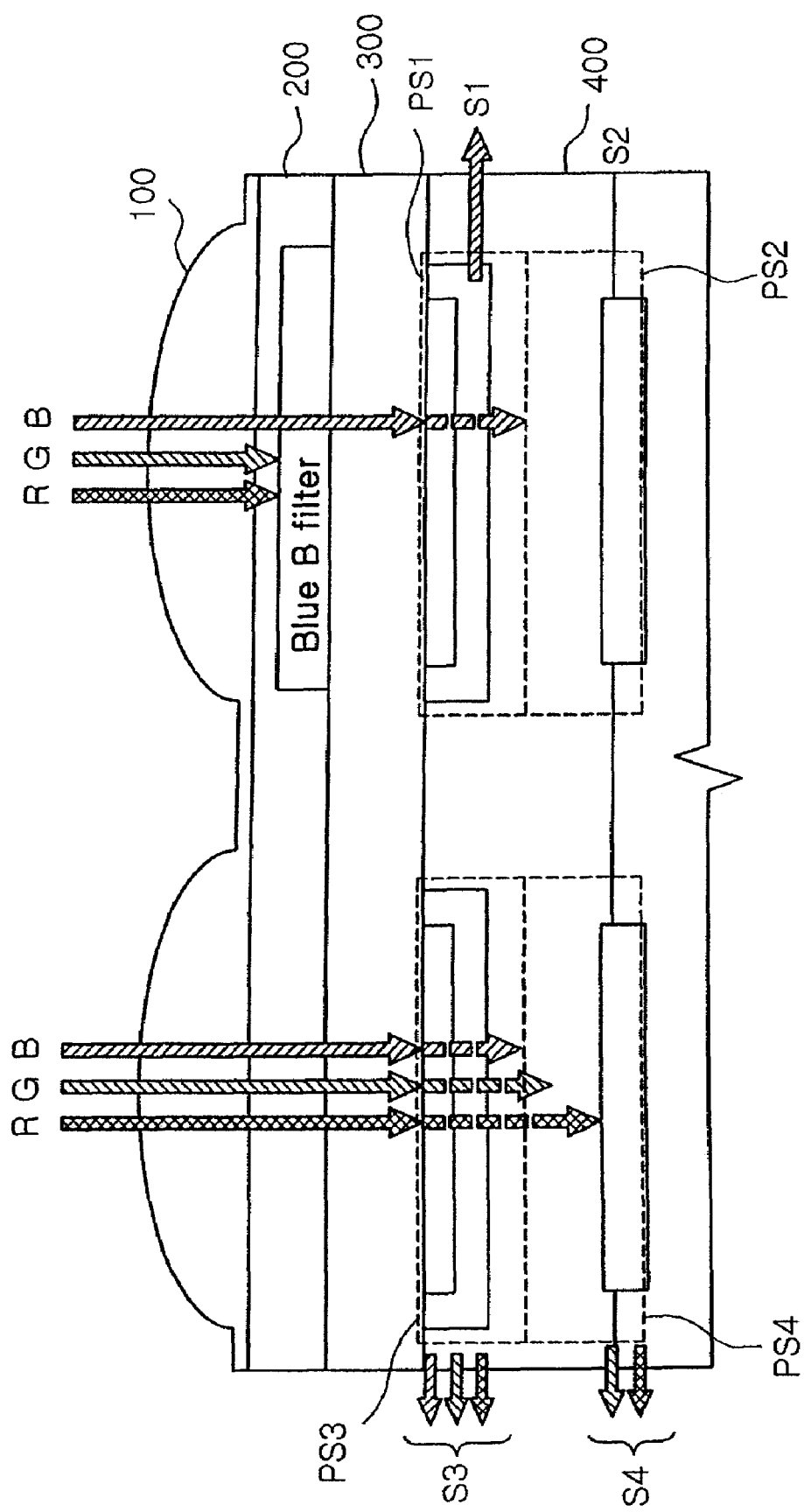

FIGS. 10a to 10c are diagrams for explaining light-sensing principle which varies according to different color filters of the color filter array of the present invention. As shown in FIGS. 10a to 10c, the third photosensor PS3 and the fourth photosensor PS4 detect light incident through the open window cell O. As the third photosensor PS3 is formed in a depth to which all colors permeate, the third signal S3 outputted from the third photosensor contains all red R, green G and blue B. In addition, as the fourth photosensor PS4 is formed in a depth to which red R and green G permeate, the fourth signal S4 outputted from the fourth photosensor PS4 contains red R and green G.

As the light passed through the color filter cell C varies according to different color filters, the first and second lights S1 and S2 contain different colors, which will be described below.

In FIG. 10a where the color filter cell C of the color filter array 200 is a red R filter, the first and second photosensors PS1 and PS2 of the pixel sensor array 400 sense red R, and thus the first and second signals S1 and S2 contain red R.

In FIG. 10b where the color filter cell C of the color filter array 200 is a green G filter, the first and second photosensors PS1 and PS2 sense green G, and thus the first and second signals S1 and S2 contain green.

In FIG. 10c where the color filter cell C of the color filter array 200 is a blue B filter, the first and second photosensors PS1 and PS2 of the pixel sensor array 400 may sense blue B, and thus the first and second signals S1 and S2 may contain blue B.

With reference to FIGS. 10a to 10c, the second depth D2 of the pixel sensor array is smaller in case of the color filter cell C of the color filter array being a green G or blue B filter than in case of the color filter cell C of the color filter array being a red R filter. As explained above, greater wavelength of light permeates to a greater depth in the silicon, and since green and blue lights have smaller wavelengths than red light, green and blue lights can be detected even at smaller depths.

The signal processor 500 (see FIG. 5) A/D converts the first signal S1, the second signal S2, the third signal S3 and the fourth signal S4 from the first photosensor PS1, the second photosensor PS2, the third photosensor PS3 and the fourth photosensor PS4 into digital signals, and then interpolates the digital signals to extract color information of red R, green G and blue B therefrom.

The signal processor 500 is capable of conducting 2 by 2 and 3 by 3 interpolation depending on the type of check pattern of the color filter array 420.

Figure 11:
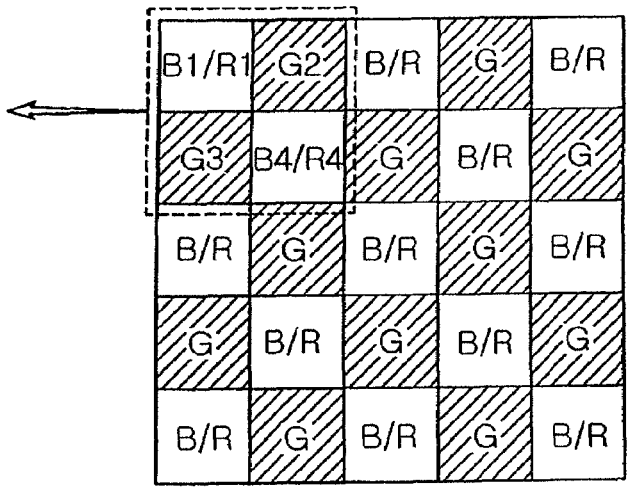
FIGS. 11(a) and (b) are diagrams for explaining interpolation of a signal processor according to the present invention.
Figure 11:
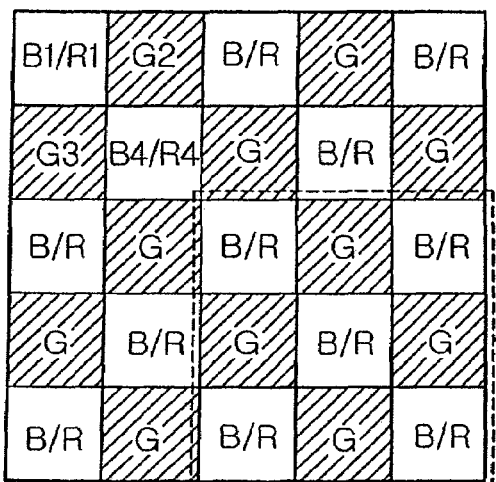

FIGS. 11(a) and (b) are diagrams for explaining the interpolation by the signal processor according to the present invention.

With reference to FIGS. 11(a) and (b), the signal processor 500 (see FIG. 5) A/D converts a light signal sensed at the 2×2 cells of unit made up of two open window cells O and two color filter cells C into a digital signal and acquires color information from the digital signal.

For example, referring to FIG. 11(a), in case where the color filter cell C of the color filter array 420 is green G, the interpolation of the 2 by 2 cells of unit can be conducted according to following Equation 3.

$$ri=(R1+R4)/2$$

$$gi=(G2+G3)/2$$

$$bi=(B1+B4)/2 \qquad \text{Equation 3}$$

As shown in above Equation 3, RGB color information ri, gi and bi for an arbitrary pixel can be obtained from the average value of two light signals. From the open window cell, not only information on red R, blue B color signals but also green signal can be obtained. However, as more accurate green G signal can be obtained from the color filter cell, green G from the open window cell does not need to be interpolated. That is, the two signals excluding the particular color signal obtained from the color filter are obtained from the open window cell.

Alternatively, the signal processor 500 can A/D convert a light signal sensed via 3 by 3 cells of unit made up of 4 open window cells O and 5 color filter cells C into a digital signal and extract color information from the digital signal.

For example, referring to FIG. 11(b), in case where the color filter cell C of the color filter array 420 is a green G filter, the interpolation for 3 by 3 cells of unit is conducted according to following Equation 4.

$$ri=(R+R+R+R)/5$$

$$gi=(G+G+G+G)/4$$

$$bi=(B+B+B+B)/5 \qquad \text{Equation 4}$$

As shown in above Equation 4, in case of interpolation for 3 by 3 cells of unit, the RGB color information ri, gi and bi for an arbitrary pixel is obtained from the average value of maximum 5 color signals. That is, the color information of red R and blue B can be obtained from the average value of adjacent 5 color signals and the color information on green G can be obtained from the average value of 4 color signals. Therefore, unlike a conventional image sensor, the image sensor according to the present invention adopts the color filter array having a check pattern so that no color information is obtained from a single color signal for both interpolations for 2 by 2 and 3 by 3 cells of units. Accordingly, even if noise occurs in the color signal or pixel, more accurate color information can be obtained as more color signals are used for the interpolation.

In the present invention as set forth above, a color filter array having open window cells alternating with single color filter cells is used in an image sensor and an image processing apparatus applied to camcorders, digital cameras, etc. This allows using color information of a plurality of colors for each pixel for interpolation, minimizing effects from defective pixels or noise to enable more accurate interpolation. As a result, more accurate color can be obtained for each pixel.

In other words, compared with the prior art, the information on three colors R, G, B can be obtained from smaller number of cells in a unit, minimizing the effects from defective pixels or noise to enable more accurate interpolation, thereby increasing the speed of image processing.

Accordingly, the problems of the CMOS image sensor such as the fixed pattern noise can be overcome, and the manufacturing processes of the color filter which is the main factor for the lower yield (about 30%) can be improved. In addition, the yield of the high-density pixel image sensors can be improved while the manufacturing cost of the image sensor is reduced.

While the present invention has been shown and described in connection with the preferred embodiments, it will be apparent to those skilled in the art that modifications and variations can be made without departing from the spirit and scope of the invention as defined by the appended claims.

What is claimed is:

1. An image sensor, comprising:
    a lens array containing a plurality of microlenses arranged in a two-dimensional matrix;
    a color filter array formed underneath the lens array and including a plurality of open window cells and a plurality of color filter cells, each of said open window cells and color filter cells corresponding to one microlens of the lens array, wherein each open window cell is adapted to pass red, green and blue lights, while each color filter cell is adapted to pass a predetermined color light;
    a protection layer formed of dielectric material underneath the color filter array; and
    a pixel sensor array formed underneath the protection layer and having
        a first photosensor for sensing a first light passed through each color filter cell,
        a second photosensor formed under the first photosensor for sensing a second light passed through each color filter cell,
        a third photosensor for sensing a third light passed through each open window cell, and
        a fourth photosensor formed under the third photosensor for sensing a fourth light passed through each open window cell;
    wherein the pixel sensor array comprises:
    a base substrate formed of P-type semiconductor material;
    an epitaxial layer formed of P-type semiconductor on the base substrate;
    a first photowell layer having a plurality of first photowell areas formed of N-type semiconductor material at a predetermined first depth from an upper surface of the epitaxial layer, wherein each of the first photowell areas forms the first photosensor and the third photosensor via P-N junction with the epitaxial layer; and
    a second photowell layer having a plurality of second photowell areas formed of N-type semiconductor material at a predetermined second depth deeper than the first depth from the upper surface of the epitaxial layer, wherein each of the second photowell areas overlaps with one of the first photowell areas and forms the second photosensor and the fourth photosensor via P-N junction with the epitaxial layer.

2. The image sensor according to claim 1, wherein the color filter array has the same corresponding dimensions as the lens array.

3. The image sensor according to claim 2, wherein each color filter cell of the color filter array is adapted to pass light of a color selected from a group consisting of red, green, blue, yellow, magenta, cyan and emerald green.

4. The image sensor according to claim 1, wherein the pixel sensor array further comprises a P+ shallow junction layer formed of P+ semiconductor material at a predetermined third depth from the upper surface of the epitaxial layer in order to prevent surface defects of the epitaxial layer.

5. The image sensor according to claim 1, wherein the first photowell layer is formed at the first depth which is about 6 µm.

6. The image sensor according to claim 1, wherein the second photowell layer is formed at the second depth which is from about 2.75 µm to about 3.5 µm.

7. The image sensor according to claim 4, wherein the P+ shallow junction layer is formed at the third depth which is from about 0.01 µm to about 2 µm.

8. The image sensor according to claim 1, wherein the second depth is smaller where the respective color filter cell is a red filter than where the respective color filter cell is a green or a blue filter.

9. An image processing apparatus, comprising:
    a lens array including plurality of microlenses arranged in a two-dimensional matrix;
    a color filter array formed underneath the lens array and including a plurality of open window cells and a plurality of color filter cells alternating with each other in rows and lines, each of said open window cells and color filter cells corresponding to one microlens of the lens array, wherein each open window cell is adapted to pass red, green and blue lights while each color filter cell is adapted to pass a predetermined color light;
    a protection layer formed of dielectric material underneath the color filter array;
    a pixel sensor array, formed underneath the protection layer and having
        a first photosensor for sensing a first light passed through each of the plurality of color filter cells,
        a second photosensor formed under the first photosensor for sensing a second light passed through each of the plurality of color filter cells,
        a third photosensor for sensing a third light passed through each of the plurality of open window cells, and
        a fourth photosensor formed under the third photosensor for sensing a fourth light passed through each of the plurality of open window cells; and
    a signal processor for A/D converting a first signal, a second signal, a third signal and a fourth signal sensed by the first photosensor, the second photosensor, the third photosensor and the fourth photosensor of the pixel sensor array, respectively, into digital signals and extracting color information from the digital signals;
    wherein the pixel sensor array comprises:
    a base substrate formed of P-type semiconductor material;
    an epitaxial layer formed of P-type semiconductor material on the base substrate;
    a first photowell layer having a plurality of first photowell areas formed of N-type semiconductor material at a predetermined first depth from an upper surface of the epitaxial layer, wherein each of the first photowell areas forms the first photosensor and the third photosensor via P-N junction with the enitaxial layer; and
    a second photowell layer having a plurality of second photowell areas formed of N-type semiconductor material having a predetermined thickness and at a predetermined second depth deeper than the first depth from the upper surface of the epitaxial layer, wherein each of the second photowell areas overlaps with one of the first photowell areas and forms the second photosensor and the fourth photosensor via P-N junction with the epitaxial layer.

10. The image processing apparatus according to claim 9, wherein the color filter array has the same corresponding dimensions as the lens array.

11. The image processing apparatus according to claim 10, wherein each color filter cell of the color filter array is adapted to pass light of a color selected from a group consisting of red, green, blue, yellow, magenta, cyan and emerald green.

12. The image processing apparatus according to claim 9, wherein the pixel sensor array further includes a P+ shallow junction layer made of P+ semiconductor material at a predetermined third depth from the upper surface of the epitaxial layer in order to prevent surface defects of the epitaxial layer.

13. The image processing apparatus according to claim 9, wherein the first photowell layer of the pixel sensor array is formed at the first depth which is about 0.6 μm.

14. The image processing apparatus according to claim 9, wherein the second photowell layer of the pixel sensor array is formed at the second depth which is from about 2.75 μm to about 3.5 μm.

15. The image processing apparatus according to claim 12, wherein the P+ shallow junction layer of the pixel sensor array is formed at the third depth which is from about 0.01 μm to about 2 μm.

16. The image processing apparatus according to claim 9, wherein the second depth is smaller where the respective color filter cell is a red filter than where the respective color filter cell is a green or a blue filter.

17. The image processing apparatus according to claim 9, wherein the signal processor is configured to A/D convert a light signal sensed via a 2×2 cell unit composed of two open window cells and two color filter cells into a digital signal and extract color information from the digital signal.

18. The image processing apparatus according to claim 9, wherein the signal processor is configured to A/D convert a light signal sensed via a 3×3 cell unit composed of four open window cells and five color filter cells into a digital signal and extract color information from the digital signal.

* * * * *